(12) United States Patent
Griepentrog et al.

(10) Patent No.: US 6,665,591 B1
(45) Date of Patent: Dec. 16, 2003

(54) PROTECTION DEVICE FOR LOW VOLTAGE NETWORKS

(75) Inventors: Gerd Griepentrog, Gutenstetten (DE); Reinhard Maier, Herzogenaurach (DE); Heinz Mitlehner, Uttenreuth (DE); Erich Zerbian, Fensterbach (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/763,658

(22) PCT Filed: Aug. 18, 1999

(86) PCT No.: PCT/DE99/02593

§ 371 (c)(1), (2), (4) Date: Apr. 24, 2001

(87) PCT Pub. No.: WO00/13280

PCT Pub. Date: Mar. 9, 2000

(30) Foreign Application Priority Data

Aug. 31, 1998 (DE) .......................... 198 39 617

(51) Int. Cl.[7] ...................... G05D 11/00; G01R 31/00
(52) U.S. Cl. ...................... 700/292; 700/286; 324/500
(58) Field of Search .................. 700/90, 292, 95, 700/286; 324/72, 500–541

(56) References Cited

U.S. PATENT DOCUMENTS 4,580,088 A * 4/1986 Bloomer ..................... 323/238
4,728,866 A * 3/1988 Capewell et al. ............ 315/224
5,055,703 A * 10/1991 Schornack .................... 307/64
6,313,639 B1 * 11/2001 Griepentrog ................. 324/500

FOREIGN PATENT DOCUMENTS

| DE | A3-4108049 | 9/1992 |
| DE | A3-19612216 | 10/1997 |
| DE | C2-19729599 | 2/1999 |
| EP | A2838887 | 4/1998 |

OTHER PUBLICATIONS

Schwahn, Texas Instruments, pp. 13–16 (1977).

* cited by examiner

Primary Examiner—Albert W. Paladini
Assistant Examiner—W. Russell Swindell
(74) Attorney, Agent, or Firm—Harness, Dickey & Pierce, P.L.C.

(57) ABSTRACT

A protection device includes a measurement device and a downstream evaluation device. The evaluation device is a unit for early short-circuit identification which actuates a semiconductor switch, which is preferably produced based on silicon carbide. The unit for early short-circuit identification preferably operates with switching thresholds which can be predetermined for the product of the current and the current rate of change, or on the basis of tolerant locus curves. In the latter case, different power factors ($0.1 < \cos_{100} < 0.9$) are used in the locus curves in a locus curve representation of the current and current rate of change. The semiconductor switch preferably contains two back-to-back series-connected switching elements based on silicon carbide.

13 Claims, 2 Drawing Sheets

US 6,665,591 B1

PROTECTION DEVICE FOR LOW VOLTAGE NETWORKS

Figure 1:
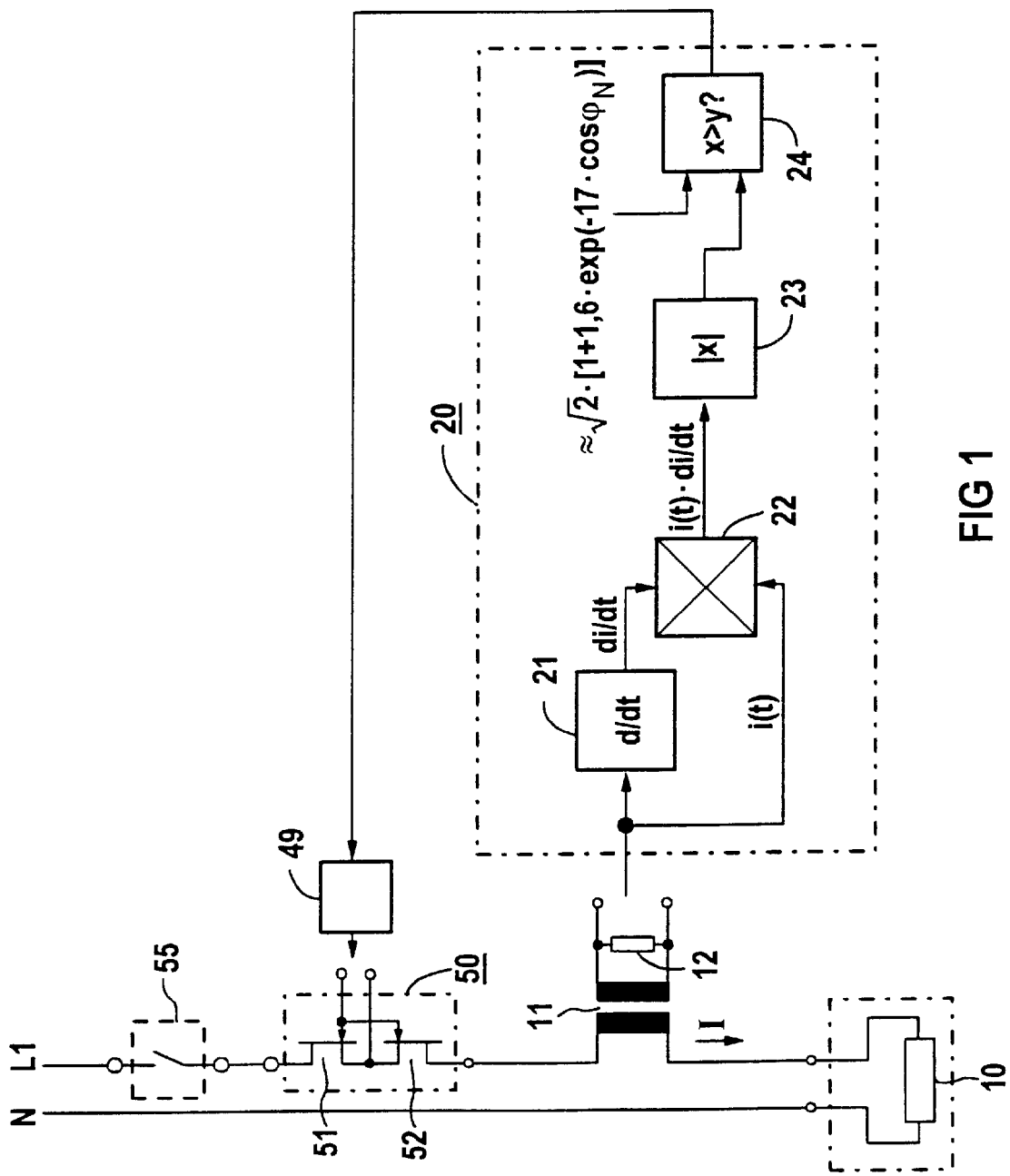

This application is the national phase under 35 U.S.C. §371 of PCT International Application No. PCT/DE99/02593 which has an International filing date of Aug. 18, 1,999, which designated the United States of America.

FIELD OF THE INVENTION

The invention relates to a protection device for low-voltage power supply systems having a measurement device and a downstream evaluation device.

BACKGROUND OF THE INVENTION

Electrical systems are stressed electro dynamically and thermally by short circuits. This stress is influenced both by the time which passes before the short circuit is identified (so-called short-circuit identification time) and by the time which is required to disconnect the short circuit (so-called disconnection time).

As is known, electronic and microprocessor-controlled evaluation circuits are used to identify overload states, but these essentially simulate the function of a bimetallic strip. In simple devices, magnetic tripping coils and bimetallic strips are used, which do not offer optimum protection. Virtually without exception, short circuits are disconnected by means of mechanical switches, with the contact separation normally starting only after a specific reaction time, and the arc which is formed resulting in a voltage which opposes the power supply system voltage. This arc voltage limits the short-circuit current and, finally, causes it to be extinguished. Switches based on conventional semiconductors are used only in exceptional cases owing to the high forward losses during normal operation.

An electrical power distribution system having automatically operating protection devices is known from EP 0 838 887 A2, in which a unit for early short-circuit identification is provided. This unit takes account of the instantaneous value of the current on the one hand, and its rate of change on the other hand. In the process, conventional circuit breakers are actuated by the unit for early short-circuit identification.

SUMMARY OF THE INVENTION

The object of the invention is to produce a protection device which identifies anomalous operating states very quickly in order to provide adequate protection against overloading and short-circuits for switching devices in low-voltage power supply systems.

According to the invention, the object relating to a protection device of the type mentioned initially is achieved in a first embodiment of the invention by the features of patent claim 1, with the dependent patent claim 2 including a specific development. In a second embodiment of the invention, the object is achieved by patent claim 3, with patent claims 4 and 5 including specific developments. Developments which apply to both alternatives are specified in the other dependent claims.

In both alternatives of the invention, the evaluation device is a unit for early short-circuit identification, which actuates a semiconductor switch, with this resulting in the faulty branch being disconnected from the power supply system. The semiconductor switch is preferably produced based on silicon carbide (SiC), as is mentioned, for example, in the case of an electronic branch switching device according to DE 196 12 216 A1. A switch such as this is preferably in the form of a so-called JFET.

In the invention, the combination of a unit, which is known per se, for early short-circuit identification with known semiconductor switches unexpectedly results in advantageous short-circuit disconnection characteristics, which can be explained by a combinational effect. This combinational effect was not regarded as being feasible, in the specialist world. Alternatively, the unit for early short-circuit identification operates on the basis of the product of the current and the current rate of change, or on the basis of so-called Tolerant Locus Curves (TLC). Especially in the case of the latter method, locus curves which take account of different power factors and initial currents are used as tripping criteria in a locus curve representation of the current and current rate of change.

The invention essentially combines device which have already been proposed in the prior art, in a novel manner. Switches based on silicon carbide are also known from recent publications. Early short-circuit identification using the current and current rate of change represents conventional prior art, while a method which operates on the principle of so-called tolerant locus curves for early short-circuit identification (TLC method) has been proposed in the prior, not previously published, EP 0 993 695 A2. In particular, those units, which operate using the TLC method, may be designed on an analog, digital or hybrid basis. The essential feature in all cases is that the switching work which needs to be carried out in the semiconductor switch is reduced by rapid short-circuit identification. This leads to smaller semiconductor volumes and thus, in particular, to smaller switches.

BRIEF DESCRIPTION OF THE INVENTION

Figure 2:
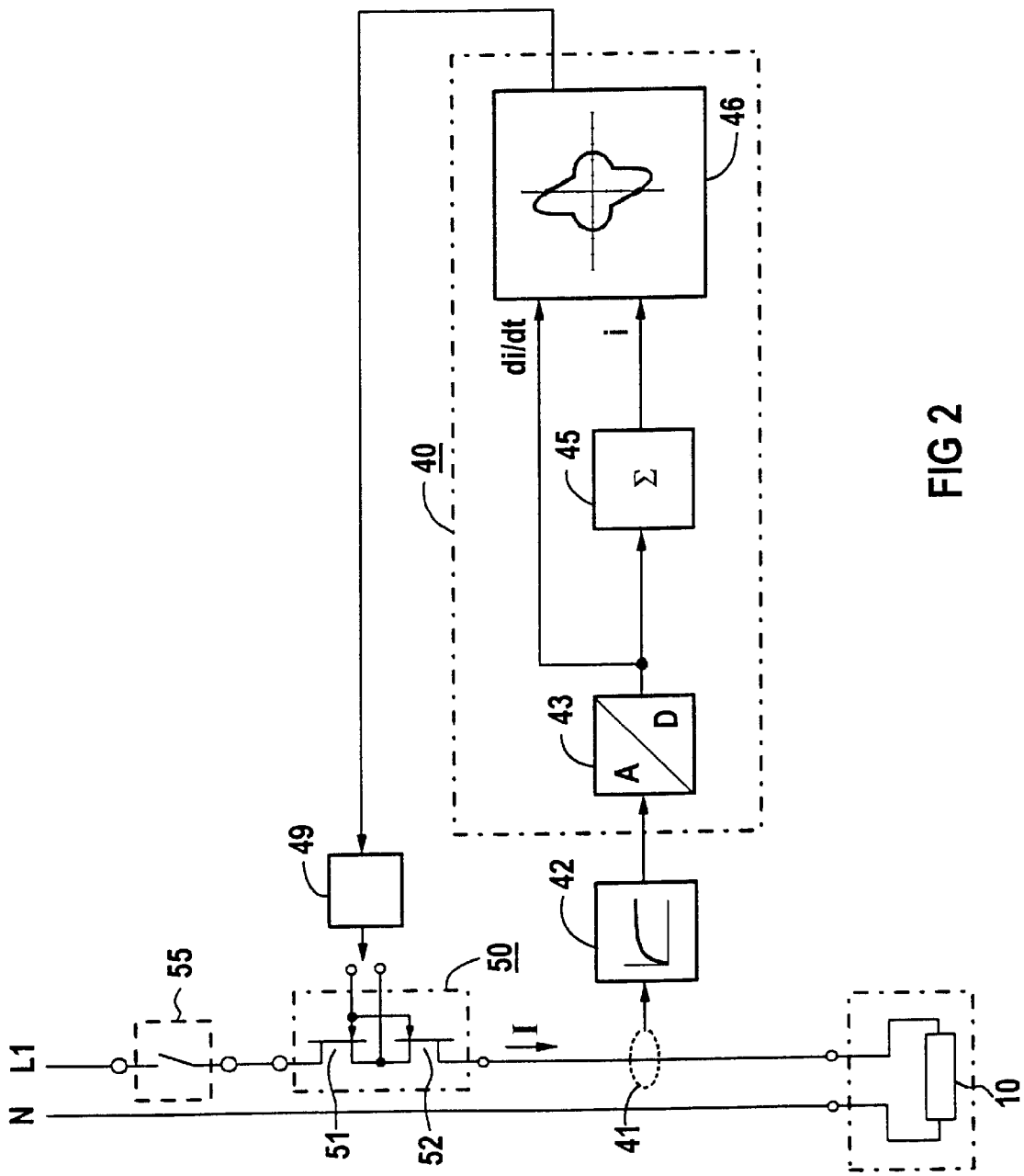

Further details and advantages of the invention will become evident from the following description of the figures of exemplary embodiments based on the drawing and in conjunction with further patent claims. In the figures:

FIG. 1 shows a first device for early short-circuit identification using the product of the current and current rate of change based on an analog-operating circuit and subsequent actuation of a semiconductor switch, based on silicon carbide, for disconnection of the faulty power supply system, and FIG. 2 shows a second device for early short-circuit identification using the tolerant locus. curve (TLC) method based on a digitally operating microprocessor and subsequent actuation of a semiconductor switch based on silicon carbide for disconnection of the faulty power supply system.

DETAILED DESCRIPTION OF PREFERRED EMBODIMENTS

FIGS. 1 and 2 each show arrangements for short-circuit identification and disconnection by means of semiconductor switches, based on a single-phase circuit. The same circuit can also be constructed on a poliphase basis.

In FIG. 1 and FIG. 2, N denotes the neutral conductor and L1 a phase conductor. A load 10 is shown connected to the conductor cables.

Specifically in FIG. 1, there is a current transformer 11 in the phase conductor L1 and this may be designed, for example, on the principle of a current transformer which is integrated in a printed circuit board. In this case, the current transformer may be in the form of a so-called multiwinding transformer, in which there are a number of secondary windings, with the current signal, as shown in FIG. 1 for example, being tapped off across a burden resistance.

A unit 20 for short-circuit identification based on the product of the current i and current rate of change $$\frac{di}{dt}$$

(instantaneous value of the current) is provided, which operates, for example, using analog signal processing. Element denotes a differentiator for forming the instantaneous value of the current rate of change $$\frac{di}{dt};$$

element 22 is a multiplier for forming the value i(t).

$$\frac{di}{dt};$$

element 23 is a unit for forming the x-magnitude; and element 27 is a comparator for checking the value x>y.

If the threshold value criteria are exceeded, the comparator 24 supplies a tripping signal which actuates a unit 49 for gate control of a so-called JFET 50. The JFET 50 can disconnect the short circuit without further delay. In order to allow switching operations in AC power supply systems, the JFET 50 comprises two back-to-back series-connected semiconductor components 51 and 52, which is known from the prior art.

Semiconductor materials based on silicon carbide have very low forward losses compared with conventional semiconductor active devices since, owing to the high breakdown field strength of the silicon carbide, very thin components can be manufactured. The forward resistance thus remains low. This has the advantage that disconnection can take place virtually without any delay after identification of a short circuit, which reduces the thermal and electrodynamic stress on the system to be protected. Rapid short-circuit identification reduces the switching work to be carried out in the semiconductor. As a result semiconductors and cooling devices can be designed smaller than in the past. At the same time, this results in low forward power losses in the main current path during normal operation.

In addition to the semiconductor switch 50 which is to be disconnected and is preferably based on silicon carbide, an isolating switch 55 may also be provided, which creates a visible isolation gap, with isolation of any conduction, once the faulty circuit has been disconnected.

In FIG. 1, a product $$\frac{di}{dt}(\cdot i)$$

is in each case predetermined in the unit 24 and is switched off whenever a specific limit value>y is exceeded. The following approximate equation may be used for this product:

$$\left.\frac{di}{dt}\right|G_{product} \approx \omega \cdot I_N^2 \cdot \sqrt{2} \cdot [1 + 1.6 \cdot \exp(-17 \cdot \cos_{\varphi_N})] \Rightarrow$$

short circuit, where $G_{product}$ is the tripping threshold value, $I_N$ is the root mean square value of the rated current, $\Omega$ the circular frequency and $\cos\phi_N$ the power factor of the power supply system during normal operation.

FIG. 2 shows, in detail, an arrangement for early short-circuit identification using the TLC criterion, for a JFET 50 based on silicon carbide. Conventional switching means may be used for this implementation. Corresponding arrangements may operate purely in analog form, purely digitally or else in hybrid form, with the latter being preferred.

FIG. 2 shows a sensor 41 for measuring the current rate of change di/dt, for example a uniform-field coil, or for measuring the current level i; an A/D converter 43 with an upstream low-pass filter 42; level matching circuit 44 (not shown) for simultaneous adjustment of the rated current level; an adder unit 45 for calculating the current i from the current rate of change di/dt or, alternatively, a differentiating unit for calculating the current rate of change di/dt from the current level i; and a digitally operating evaluation device 46 which compares the measured values with the TLC criterion and actuates a release 47 when a short circuit is identified.

FIG. 2 uses a graph with $1:I_N$ plotted on the abscissa and $$1/(\omega \cdot I_N) \cdot \frac{di}{dt}$$

plotted on the ordinate, for the evaluation unit 46. This locus curve shows an envelope 3, which includes all the switching states for a predetermined switching angle range on the one hand and a power factor range of 0.1< cosφ<0.9 on the other hand. The envelope 3 thus takes account of all the locus curves for any given switching angles and for the envelope which is initially determined from this for various power factors, in a common curve. This means that a short circuit is present in a situation where an operating point (which is formed by the instantaneous values of the current i and current rate of change di/dt) outside the envelope 3 that has been formed occurs during operation of a system. This now results in independence between the power factor and initial current, within the predetermined limits, with the decision feature being referred to as the so-called TLC criterion (tolerant locus curve criterion). Investigations relating to this method are described in detail in the prior German Patent Application 197 29 599.1.

The arrangements shown in FIG. 1 or 2 can be used for rapid identification of short circuits in low-voltage power supply systems in conjunction with the JFET 50. To this end, the JFET is preceded by a unit 49 for gate actuation, which operates using a predetermined algorithm. The JFET 50 may in each case be followed by a mechanical isolator 55.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A protection device for low-voltage power supply systems comprising:
   a measurement device; and
   a downstream evaluation device, wherein the evaluation device is a unit for early short-circuit identification which evaluates instantaneous values of current (i) and current rate of change (di/dt) and utilizes the product (di/dt) i as a limit value for a short circuit, and wherein a semiconductor switch is actuated by the unit for early short-circuit identification when a short-circuit is identified.

2. The protection device as claimed in claim 1, wherein in the following approximate relationship applies to the product (di/dt)-i:

$$\left.\frac{di}{dt}\right)G_{product} \approx \omega \cdot I_N^2 \cdot \sqrt{2} \cdot [1 + 1.6 \cdot \exp(-17 \cdot \cos\varphi_N)] \Rightarrow$$

short circuit,
where
   $G_{product}$: tripping threshold value wherein a short circuit is present when this value is exceeded
   $I_N$: root mean square value of the rated current
   $\omega$: circular frequency of the power supply system
   $\cos\varphi_N$: power factor of the power supply system during normal operation.

3. A protection device for low-voltage power supply systems comprising:
   a measurement device; and
   a downstream evaluation device, wherein the evaluation device is a unit for early short-circuit identification which evaluates instantaneous values of current and current rate of change and operates on the basis of tolerant locus curves (TLC method), wherein locus curves which utilize different power factors ($0.1 \leq \cos\varphi \leq 0.9$) are used as tripping criteria for a short circuit in a locus curve representation of the current and current rate of change, and wherein a semiconductor switch is actuated by the unit for early short-circuit identification when a short-circuit is identified.

4. the protection device as claimed in claim 3, wherein the unit for early short-circuit identification which operates using the TLC method includes digital switching means.

5. the protection device as claimed in claim 3, wherein the unit for early short-circuit identification which operates using the TLC method includes analog switching means.

6. the protection device for low-voltage power supply systems as claimed in claim 1, wherein the semiconductor switch is produced based on silicon-carbide.

7. the protection device as claimed in claim 6, wherein the semiconductor switch is a JFET.

8. the protection device as claimed in claim 1, wherein two back-to-back series-connected semiconductor components are connected as semiconductor switches.

9. the protection device as claimed in claim 1, wherein a mechanical isolating switch is associated with the semiconductor switch.

10. The protection device for low-voltage power supply systems as claimed in claim 3, wherein the semiconductor switch is produced based on silicon carbide.

11. The protection device as claimed in claim 10, wherein the semiconductor switch is a JFET.

12. The protection device as claimed in claim 3, wherein two back-to-back series-connected semiconductor components are connected as semiconductor switches.

13. The protection device as claimed in claim 3, wherein a mechanical isolating switch is associated with the semiconductor switch.

* * * * *